(12) United States Patent
Susi et al.

(10) Patent No.: US 12,196,777 B2
(45) Date of Patent: Jan. 14, 2025

(54) FERROMAGNETIC DETECTOR AND THREAT ANALYSIS

(71) Applicant: Iradimed Corporation, Winter Springs, FL (US)

(72) Inventors: Roger E. Susi, Winter Park, FL (US); Winston Matthew Todd, Winter Springs, FL (US); Dane E. Bouchie, Sanford, FL (US)

(73) Assignee: Iradimed Corporation, Winter Springs, FL (US)

( * ) Notice: Subject to any disclaimer, the term of this patent is extended or adjusted under 35 U.S.C. 154(b) by 0 days.

(21) Appl. No.: 18/689,325

(22) PCT Filed: Sep. 13, 2022

(86) PCT No.: PCT/US2022/076327
§ 371 (c)(1),
(2) Date: Mar. 5, 2024

(87) PCT Pub. No.: WO2023/044294
PCT Pub. Date: Mar. 23, 2023

(65) Prior Publication Data
US 2024/0410913 A1    Dec. 12, 2024

Related U.S. Application Data

(60) Provisional application No. 63/245,313, filed on Sep. 17, 2021.

(51) Int. Cl.
*G01P 3/50*    (2006.01)
*G01P 1/07*    (2006.01)
(Continued)

(52) U.S. Cl.
CPC .............. *G01P 3/50* (2013.01); *G01P 1/07* (2013.01); *G01R 33/288* (2013.01); *G01V 3/08* (2013.01); *G01V 3/081* (2013.01)

(58) Field of Classification Search
CPC .... G01P 3/50; G01P 1/07; G01V 3/08; G01V 3/081; G01R 33/288
(Continued)

(56) References Cited

U.S. PATENT DOCUMENTS 7,414,404 B2    8/2008    Keene
7,489,128 B2    2/2009    Kopp
(Continued)

FOREIGN PATENT DOCUMENTS

CN    206248838    6/2017

OTHER PUBLICATIONS

International Search Report and Written Opinion; PCT/US2022/076327; dated Dec. 2, 2022; 23 pages.

*Primary Examiner* — Raul J Rios Russo
(74) *Attorney, Agent, or Firm* — Knobbe Martens Olson & Bear LLP

(57) ABSTRACT

Apparatus, systems and processes for detection of objects representing possible projectile hazards in areas of high magnetic fields such as those potentially hazardous ferrous objects which may be moved within the region of forceful magnetic attraction by magnetic resonance imaging (MRI) scanners. The systems and process may include multiple magnetic field sensors and multiple time of flight sensors positioned around a passageway. The time of flight sensors may facilitate determination of movement (e.g., speed and/or direction) of the potentially hazardous ferrous object to provide enhanced accuracy of threat detection.

15 Claims, 7 Drawing Sheets

(51) Int. Cl.
 *G01R 33/28* (2006.01)
 *G01V 3/08* (2006.01)
(58) Field of Classification Search
 USPC .................................................. 324/207.22
 See application file for complete search history.

(56) References Cited

U.S. PATENT DOCUMENTS

| | | | |
|---|---|---|---|
| 7,545,140 | B2 | 6/2009 | Humphreys et al. |
| 8,148,989 | B2 | 4/2012 | Kopp |
| 8,378,836 | B2 | 2/2013 | Kopp et al. |
| 2003/0171669 | A1 | 9/2003 | Kopp |
| 2011/0298449 | A1* | 12/2011 | Foletto .................... G01P 3/487 |
| | | | 324/207.13 |
| 2013/0249536 | A1* | 9/2013 | Foletto .................... G01P 21/00 |
| | | | 324/207.12 |
| 2016/0131788 | A1 | 5/2016 | Kopp |
| 2019/0064114 | A1* | 2/2019 | Timmons ............... G01N 27/85 |
| 2020/0135004 | A1* | 4/2020 | Ellenbogen ............. G07C 9/38 |
| 2021/0033743 | A1* | 2/2021 | Keene .................. G08B 21/182 |
| 2022/0250666 | A1* | 8/2022 | Van Der Schrieck .. G01P 13/04 |

\* cited by examiner

MAGNITUDE
SENSOR AC
SIGNAL

MAGNITUDE
SENSOR AC
SIGNAL w/uP
FILTER

MAGNITUDE SENSOR
AC SIGNAL
w/uP FILTER SHOWING
POSSIBLE THREAT

FERROMAGNETIC DETECTOR AND THREAT ANALYSIS

CROSS-REFERENCE TO RELATED APPLICATIONS

This application claims the benefit of priority to U.S. Provisional Patent Application No. 63/245,313, filed Sep. 17, 2021, entitled "FERROMAGNETIC DETECTOR AND THREAT ANALYSIS," which is hereby incorporated by reference herein in its entirety.

FIELD OF THE DISCLOSURE

The present disclosure generally relates to occupational and/or medical/clinical safety and more specifically relates to systems and methods of detecting and alerting, without human intervention, the approach of ferrous objects of a size and/or mass that can present a projectile hazard in locations of high magnetic fields (such as magnetic fields that are frequently found near magnetic resonance imaging ("MRI") scanning "magnets") while reducing (e.g., minimizing) the detection of objects that are not magnetically attractable and so are of little hazard in such high magnetic field locations.

BACKGROUND

Detection of metallic objects is performed for security purposes in such locations as airports and prisons generally to discover hidden objects with the potential to be used as weapons. Detection of metallic objects can also be used for locating hidden or buried metallic objects. Such devices generally detect any sort of metal, not just ferrous objects, and generate a stimulating alternating magnetic field to excite the metallic object and obtain a relatively strong signal for their sensors to measure.

In other cases, it may be desirable to detect only magnetically attractive (ferrous) objects, such as for safety purposes near large magnetic field-producing machinery. MRI machines are often located in various medically oriented facilities (e.g., hospitals, out-patient, free-standing imaging centers, veterinary clinics, etc.). Typical MRI scanners currently produce fields of 1.5 to 3 Tesla with some designs at 7 Tesla to 12 Tesla, within their central imaging area. Even MRI systems with lower fields such as 1 Tesla and less have documented serious projectile hazards. Though shielding is often provided which reduces the fringe field's reach, should ferrous objects become entangled with the stray field, they can be accelerated towards the central field at dangerous rates. Such a phenomenon is known as the projectile effect and has caused much-documented harm to patients and attending clinical staff, including death. Significant stray fields reach 2 meters and beyond from the central bore, and the shielding can lead to a very rapid rise in field strength with each small movement into such fields.

SUMMARY

The present disclosure provides a system for detecting ferromagnetic, or ferrous, objects and analyzing the threat of the ferromagnetic, or ferrous, objects becoming projectile hazards as they pass through a passageway (such as a doorway into an MRI scan room). The system includes a first sensor array including one or more magnetic field sensors (e.g., amorphous magnetic impedance sensors). One or more magnetic field sensors may be configured to be secured, coupled, or attached to one or more portions of the passageway (e.g., door jambs, door posts, lintel, sill) or a wall adjacent to the passageway. The first sensor array is configured to generate one or more first signals (e.g., a first signal) in response to detecting a magnetic field indicating the presence of a ferromagnetic object in proximity to the first sensor array and to output the first signal. The system includes at least one second sensor, or second sensor group including multiple second sensors, configured to be secured, coupled, or attached to a portion of the passageway (e.g., door jamb, door post, lintel, sill). The second sensor group is configured to generate one or more second signals (e.g., a second signal) in response to an object moving relative to the passageway and in proximity to the passageway and to output the second signal. The second signal includes information relating to a velocity of an object and direction of motion of the object relative to the first sensor array.

The system may also include a processing means (e.g., one or more processors, such as microprocessors) in communication with the first sensor array and the second sensor group. The processing means may be configured (e.g., programmed with executable instructions stored in memory of the processing means or in memory communicatively coupled to the processing means) to receive the first signal from the first sensor array, determine a magnitude of the first signal, receive the second signal from the second sensor group, determine the velocity of the object relative to the passageway and the direction of motion of the object relative to the passageway, and generate an alert indicating a threat level of the object passing through the passageway based upon both the second signal (e.g., indicative of two-dimensional movement detected by the second sensor group and the first signal (e.g, magnetic signals) of the first sensor array. The threat level may be based, at least in part, on the magnitude of the first signal, along with the velocity of the object, and the direction of motion of the object determined by the second sensor group.

In some implementations, the processing means may be configured to generate the alert if the magnitude of the first signal exceeds a first threshold and the velocity of the object exceeds a second threshold.

In some implementations, the processing means may be configured to dynamically and in real time adjust the first threshold based on the velocity of the object and the direction of motion of the object.

In some implementations, the second sensor group may be configured to be secured or attached to a top portion of the passageway (e.g., a top beam, post, lintel, a portion of a wall above the passageway), and the second sensor group may include a first pair of sensors. The first pair of sensors may be configured to face toward a portion of the passageway to detect a motion of a door, a portion of the passageway, or a motion of an object passing through the passageway. The second sensor group may also include a second pair of sensors that may be configured to face in a downward direction to detect motion of objects as they approach the passageway. The second sensor group may also include a third pair of sensors configured to face away (e.g., outward) from the passageway to detect motion of objects as they move towards the passageway.

In some implementations, the first sensor array, the second sensor group, and the processing means may each be configured (e.g., based on execution of computer-readable program instructions) to enter a sleep-mode in response to the first sensor array detecting the door portion of the passageway being in a closed state and to enter an operation-mode in response to the second sensor group detecting the door portion of the passageway being in an open state.

In some implementations, the first sensor array may include a first sensor grouping configured to magnetically monitor a first frame portion (e.g., left side rail) of the passageway. The first sensor grouping may include a first magnetic field sensor or pair of magnetic field sensors configured to monitor a top portion of the first frame portion, a second magnetic field sensor or pair of magnetic field sensors configured to monitor a middle portion of the first frame portion, and a third magnetic field sensor or pair of magnetic field sensor configured to monitor a bottom portion of the first frame portion.

The first sensor array may include a second sensor grouping configured to secure to a second frame portion (e.g., right side rail) of the passageway. The second sensor grouping may include a fourth magnetic field sensor or pair of magnetic field sensors configured to secure to a top portion of the second frame portion, a fifth magnetic field sensor or pair of magnetic field sensors configured to secure to a middle portion of the second frame portion, and a sixth magnetic field sensor or pair of magnetic field sensors configured to secure to a bottom portion of the second frame portion.

In some implementations, the system may include a plurality of light-emitting diodes ("LEDs") configured to secure to the passageway and emit light of one or more colors (e.g., one, two, three, or more colors). Each of the one or more colors may indicate a unique status or condition of an alert, and the statuses or conditions of alert may include, for example, (1) no threat, (2) potential threat, and/or (3) actual threat. In one example, no threat may correspond to a green color, potential threat may correspond to a yellow color, and actual threat may correspond to a red color.

In some implementations, the system may comprise a display in communication with the processing means and the processing means may be configured to output the generated alert to the display. The alert may also include audible alerts in addition to visible alerts. The audible alerts may be different depending on the status or condition of the alert.

In some implementations, the second sensor group configured to generate the one or more second signals may include a plurality of sensors for detecting motion of objects and the plurality of sensors of the second sensor group may be configured to not use magnetic field fluctuations.

In some implementations, the second signals may include information relating to the distance between the object and the passageway and the processing means may be configured to determine the distance.

In some implementations, the second sensor group may detect position and position change over time of an object, which can be processed into velocity data and directional data. The processed data can be used for precautionary warnings as an object is approaching the sensors (e.g., prior to the generation of actual threat alerts). The precautionary warnings may not include audible warnings in some implementations. The visible output may be the same as the aforementioned alerts or may be presented differently.

In some implementations, the second sensor group may output additional signals which relate to the distance between the second sensor group and the passageway (e.g., door of the passageway). Such signals can be utilized to determine the distance of the door and/or estimate the door's angular position when closed so that the system can effectively learn the closed-door position.

In some implementations, the second sensor group may be utilized to determine if the door position is open or closed based upon the threshold from the learned closed-door position. Determining if the door distance relative to the second sensor group (nominal distance or angular distance) is smaller than the closed-door threshold can be used to identify if the door is in a position to prevent entry from a person or hazardous-sized object. If the threshold from the learned closed-door position is crossed, it can identify the door as being sufficiently open, thereby allowing a person or hazardous-sized object entry.

In some implementations, the second sensor group may calculate door speed utilizing the data acquired from the door distance (nominal or angular) as it changes. The calculated door speed can be used to determine if the door is moving.

In some implementations, the system and/or method may include filtering out stationary objects (e.g., doorway, floor, carts, cabinets, etc.) detected by the second sensor group (for example, by implementing a high pass filter applied to the second sensor group or portions of the second sensor group). In accordance with several implementations, a stationary object detected by the second sensor group that does not change in distance will not falsely indicate motion.

In some implementations, the system and/or method may include filtering out noise caused by stationary objects (e.g., door frame) through a calibration or learning process that maps the local environment. The mapped environment can be utilized in data processing with the distances measured by the objects in the environment in order to detect if the object is in motion or if the object is stationary.

In some implementations, the system and/or method may include filtering out noise caused by partially detected stagnant objects by determining noisy regions in the field of view of the second sensor group and adding a noise floor threshold so the noise is not considered. Such noise floor threshold may be added to the entire output of a second sensor group or only to limited regions in the field of view of the second sensor group.

In some implementations, status data and log data can be sent to a respective network (e.g., hospital communications network) through a wired or wireless network connection.

The method of sending logs to the respective network (e.g., hospital network) can be an Ethernet connection to a remote alarm and logging unit ("RALU"). The format may be specific to the end application and application programming interface ("API") the data will be used for. Log data may include, for example, the date, time, overall classification type, damage type, and/or injury type. Status data may include, for example, if the door is open, closed, moving, and/or if the system is alarming, or warning.

In some implementations, the second sensor group signals may be directly comprised of motion data, or gesture data processed from the sensor directly. Gesture data may instead be a different signal from which velocity may or may not be determined along with a signal indicative of a gesture.

In some implementations, the individual outputs within multiple points of the second sensor group's field of view, of the first sensor array, may be compared to estimate the location of ferrous, or ferromagnetic, material.

In accordance with several embodiments, a method for detecting ferromagnetic objects and analyzing the threat of such objects passing through a passageway is provided. The method includes generating, by a first sensor array including one or more magnetic field sensors configured to be secured or attached to one or more portions of the passageway, a first signal in response to detecting a magnetic field indicating the presence of a ferromagnetic object in proximity to the first sensor array. The method also includes outputting the first signal to a processing means (e.g., one or more processors, such as microprocessors). The method further includes generating, by a second sensor group configured to be secured or attached to a portion of the passageway, a second signal in response to an object moving relative to the passageway and in proximity to the passageway. The method also includes outputting the second signal to the processing means.

The second signal may include information relating to the velocity of the object and direction of motion of the object relative to the first sensor array. The method may also include receiving, by the processing means, the first signal from the first sensor array and determining, by the processing means, a magnitude of the first signal. The method may further include receiving, by the processing means, the second signal from the second sensor group and determining, by the processing means, the velocity of the object relative to the passageway and the direction of motion of the object relative to the passageway. The method may also include generating, by the processing means, an alert indicating a threat level of the object passing through the passageway. In some implementations, the threat level may be based, at least in part, on the magnitude of the first signal, the velocity of the object, and the direction of motion of the object.

In some implementations, the method may include generating the alert if the magnitude of the first signal exceeds a first threshold and the velocity of the object exceeds a second threshold.

In some implementations, the method may include gating the alert signal only when the door is open or open beyond a programmed threshold, that is, not alarming when the door is insufficiently open or in motion and when the door is closed.

The method of only alarming when the door is open can be implemented as a check before the alert is produced by not producing the alert if the door is moving or if the door is currently closed In some implementations, the method may comprise gating the signal output of sensors of the first sensor array, or raising the first sensor threshold alert level, of the first sensor that is located near a door handle or doorknob when the door is closed or moving, for the application of reducing false alerts caused by ferrous metal in the doorknob or handle motion.

In some implementations, the method may include adjusting, dynamically and in real time, the first threshold based on the velocity of the object and the direction of motion of the object.

In some implementations, the method may include detecting, by a first pair of sensors of the second sensor group configured to secure to a top portion of the passageway and face toward a portion of the passageway, a motion of a door portion of the passageway or a motion of an object passing through the passageway; detecting, by a second pair of sensors of the second sensor group configured to secure to a top portion of the passageway and to face in a downward direction, a motion of objects approaching the passageway; and detecting, by a third pair of sensors of the second sensor group configured to secure to a top portion of the passageway and to face away from the passageway, a motion of objects.

In some implementations, the method may include causing the first sensor array, the second sensor group, and the processing means to enter a sleep-mode in response to the second sensor group detecting the door portion of the passageway being in a closed state; and enter an operation-mode in response to the second sensor group detecting the door portion of the passageway being in an open state.

In some implementations, the first sensor array may include a first sensor grouping configured to be secured or attached to a first frame portion of the passageway. The first sensor grouping may include a first singular magnetic field sensor or pair of magnetic field sensors configured to be secured or attached to a top portion of the first frame portion, a second singular magnetic field sensor or pair of magnetic field sensors configured to be secured or attached to a middle portion of the first frame portion, and a third singular magnetic field sensor or pair of magnetic field sensors configured to be secured or attached to a bottom portion of the first frame portion. The first sensor array may include a second sensor grouping configured to be secured or attached to a second frame portion of the passageway. The second sensor grouping may include a fourth singular magnetic field sensor or pair of magnetic field sensors configured to be secured or attached to a top portion of the second frame portion, a fifth singular magnetic fields sensor or pair of magnetic field sensors configured to be secured or attached to a middle portion of the second frame portion, and a sixth singular magnetic field sensor or pair of magnetic field sensors configured to be secured or attached to a bottom portion of the second frame portion. In some implementations, the pairing of magnetic field sensors is configured to increase the sensitivity of the pairing to changes in magnetic fields and/or reduce magnetic signal noise by the differential connection of the pairs.

In some implementations, the method may include, by one or more LEDs configured to be secured or attached to the passageway and to emit light of one or more colors: emitting a first color (e.g., green) indicating a first status of the alert corresponding to no threat being present; emitting a second color (e.g., yellow) indicating a second status of the alert corresponding to a potential threat being present; emitting a third color (e.g., red) indicating a third status of the alert corresponding to an actual threat being present.

In some implementations, the method may include outputting the generated alert to a display. The method may also include generating one or more audible alerts indicative of the status of the determined alert.

In some implementations, the method may include not using magnetic field fluctuations, by the second sensor group, to detect the motion of objects.

In some implementations, the method includes determining, by the processing means, a distance between the object and the passageway, based in part on information in the second signal relating to the distance.

In some implementations, the method includes determining, by the processing means, the position of an object in a coordinate system, based in part on information in the second signal relating to said distance.

In some implementations, the method includes determining, by the processing means, the velocity of an object, based in part on information in the second signal relating to said distance.

In some implementations, the method includes determining, by the processing means, the door distance, the door angular distance, the door motion, the door velocity and the door angular velocity.

In some implementations, the method includes determining, by the processing means, when to ignore ferrous output by the sensor located next to the door handle to reduce false alarms caused by moving ferrous metal in a door handle/knob.

In some implementations, the method includes comprising filtering, by the processing means, of stagnant objects without motion, and noise produced by stagnant objects Various embodiments of systems, methods, and devices within the scope of the appended claims each have several aspects, no single one of which is solely responsible for the desirable attributes described herein. Without limiting the scope of the appended claims, the description below describes some prominent features.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

The present disclosure provides systems and methods for optimized detection of ferrous, or ferromagnetic, objects which may be introduced to high magnetic field areas such as near MRI machines. For the MRI environment, there exist various devices for the detection and issuance of warning alerts that specifically claim to detect ferrous objects of the size/mass which represent a projectile hazard. It should be noted that detection of objects such as steel hair pins, paper clips, and the like may be desirable for other reasons, however, such low mass items do not typically represent a projectile hazard. However, the systems and methods disclosed herein may be configured (e.g., with increased sensitivity) to also screen out such smaller objects, which though not presenting a risk of high impact harm due to "flying", may present other risks such as radiofrequency ("RF") heating, image degradation, and such.

Keene in U.S. Pat. No. 7,113,092 presents an apparatus for detecting ferromagnetic objects in the vicinity of a magnetic resonance scanner. The Keene device utilizes a fluxgate sensor though includes a list of various then-known magnetic sensors such as magneto-resistive, magneto-impedance, hall-effect, and galvanic coil type sensors as possible alternate sensing means. Keene relies upon the alteration of the rather static ambient magnetic field presented by the Earth's natural background field, caused by the close passing of a ferromagnetic object. Keene further teaches using simple high and low pass filtering to remove the DC (Earth's static field) signal and higher frequency ambient magnetic noise, such as from power supplies and harmonics thereto.

After such basic filtering and undisclosed levels of amplification, Keene utilizes a simple comparator with a manually set threshold to trigger a warning that the level of the filtered magnetic sensor's output has occurred above the pre-set comparator limit. Keene further teaches that for larger openings (doorways), a second sensor can be added with a parallel "oring" of the threshold trip of this second sensor.

Keene recognizes that his device is prone to false alarms, and so teaches limiting false alarms with the addition of a "second" non-magnetic sensor to detect an object passing through the doorway by breaking a beam of light with this second non-magnetic switch "anded" with the magnetic sensor's latched comparator output to allow the alert to proceed.

Figure 3:
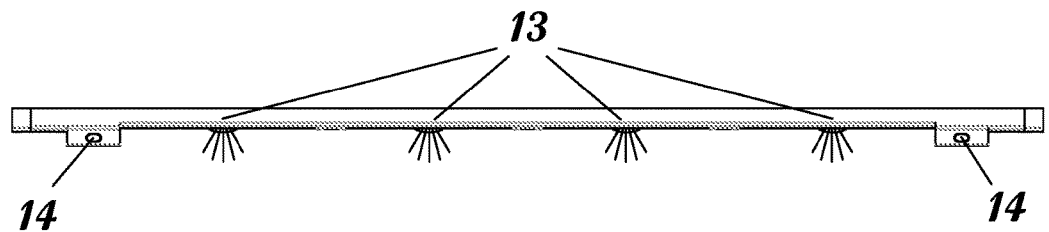
FIGS. 3-4 illustrate example embodiments of the second sensor group including time of flight sensors (e.g., each with a matrix of detection elements covering a field of view).
Figure 4:
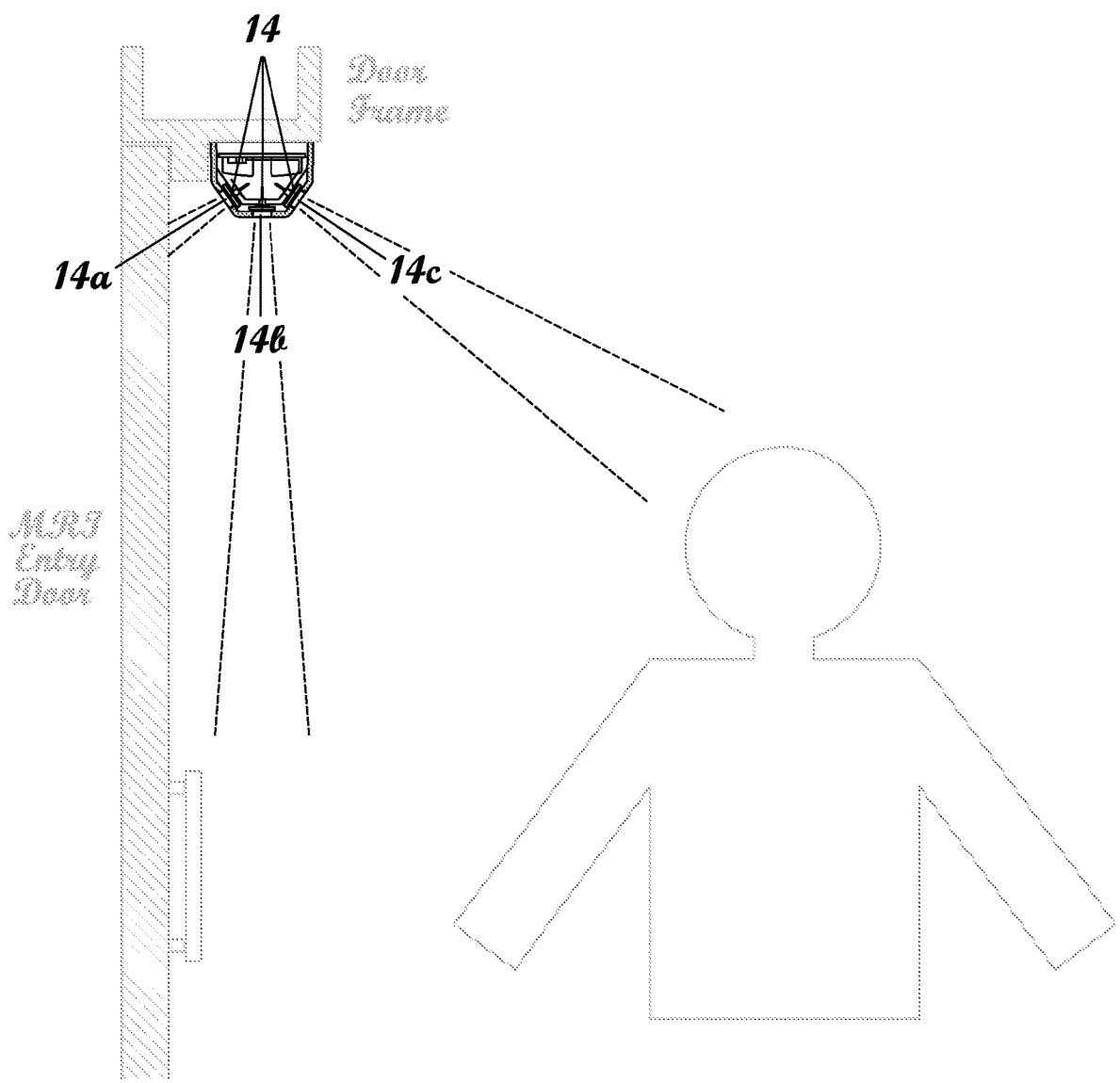

Keene's invention detects the hazardous ferrous object solely based upon the magnetic signal exceeding a fixed level. This detection level, though adjustable, is not time-variant with real-time conditions. The use of the second non-magnetic sensor is purely used as an alarm gate, as can be seen in Keene's drawings (FIGS. 3 and 4). Movement, neither speed nor direction, is not gleaned from this second non-magnetic sensor. No real-time threshold adaptations occur.

A second patented approach was granted to Kopp in U.S. Pat. No. 7,489,128 based primarily on Kopp's reliance upon the stray (residual) field of the MRI magnetic field to increase the magnetic effect of the passing ferrous object presented to Kopp's use of Hall-effect sensors, as well as Kopp's method of "discriminating out far field magnetic disturbance" (which is a statement from the USPTO Examiner's statement of reasons for allowance). The Kopp patent teaches amplifying and band pass filtering of the Hall effect sensor signals, and that, with no detail, a signal processor and alarm generator device analyzes incoming amplified sensor signals and "based on programed parameters" determines if an alarm should be issued. Kopp states that his "analysis may include" a bandpass filter with signals analyzed over time to determine the speed of approach and then to apply upper and lower limits to prevent false alarms. What the analysis claims to include is some method, without apparent disclosure, of discriminating out far field magnetic disturbance.

It should be noted that though Kopp claims to be able to determine the speed of approach, only a crude indication of the speed of the ferrous object may be determined by the slope (1st derivative) of the filtered sensor output signal as the band pass will roll off the sensor's signal change for slow-moving objects while allowing those moving faster to ramp the filtered signal to a higher level. This slope is entirely related to the filter's frequency response, as the DC coupled signal from the sensor will be the same regardless of the speed of the object, and the amount of gain applied to the AC coupled signal as well as the mass of the object. Only by knowing in advance the ferrous mass and geometric properties of the object could its actual speed be determined. There is no further discussion of how the detection threshold may be adjusted in real-time based upon the "speed" so estimated by the magnetic sensor's signal rate of change.

Kopp in U.S. Pat. No. 9,651,701 appears to add detail to his method for signal analysis. Kopp states that, along with detectors passively monitoring residual magnetic field intensity from the MRI apparatus, there is a "corrector" to correct each sensor from far field disturbance. This reads as more detail relating to his disclosure in the earlier '128 patent of "discriminating out far field disturbance." The "corrector" is revealed to be a summing of all signal values (signals from each sensor), divided by the number of sensors with the resultant average subtracted from each sensor's output. It is not disclosed if this "correction" is made to the DC sensor output, thus correcting the far static magnetic effects upon the sensor group, or if the AC (filtered) coupled sensor signals as used, correcting for far field more transient disturbances. But in either case, such a corrector is not applied to adaptively modify the threshold of a sensor's output, resulting in the trigger for a hazardous ferrous signal. Nor is the threshold adjusted in any way for the speed or direction of the movement of the ferrous object.

In accordance with several embodiments, the systems and methods described herein advantageously take into account the motion of the object (e.g., speed and/or direction) in detecting potential magnetic hazards, thereby providing a more accurate and more robust system that is less prone to false alarms that would likely lead to disabling or ignoring of the alarm system, which would, in turn, reduce safety instead of enhancing safety.

Example Devices and Embodiments of the Ferromagnetic Detection System

Figure 1:
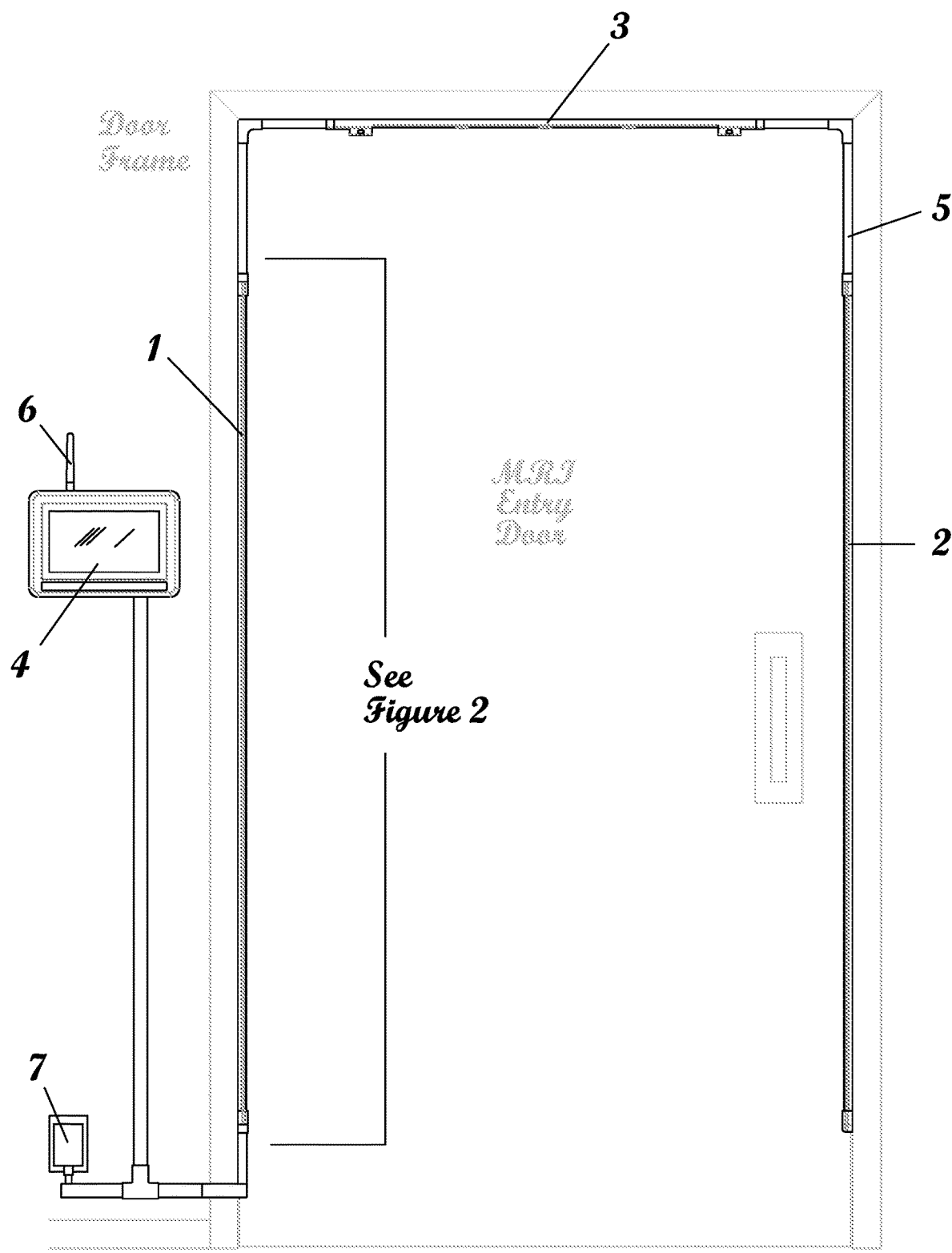
FIG. 1 illustrates an example embodiment of a system for detecting ferromagnetic objects, determining their threats, and indicating alert.

FIG. 1 shows an example embodiment of a ferromagnetic detection (FMD) system that includes two sensor rails 1 & 2, which may be attached directly to a respective door jamb or other suitable mounting brackets on either side of a passageway (e.g., doorway) needing detection of ferromagnetic objects (e.g., an MRI scan room). The sensor rails 1 & 2 may alternatively be secured or attached to portions of a wall adjacent to the passageway (e.g., doorway). The sensor rails 1 & 2 may include multiple magnetic sensors (e.g., highly sensitive amorphous magnetic sensors), multiple indicator lights (e.g., tri-color indicator lights), and one or more processors with radio and serial communications.

Further shown in FIG. 1 is a two-dimensional threat approach (e.g., time of flight sensor) rail 3 and a remote alarm and logging unit (RALU) 4. FIG. 1 further shows a wired connection 5 of the left side rail 1 through to the threat of approach rail 3 and on to the right-side rail 2. This wired connection 5 may include serial (e.g., universal asynchronous receiver-transmitter ("UART") and inter-integrated circuit ("I2C")) communications which may link the one or more processors (e.g., microprocessors) of sensor rails 1 and 2, as well as facilitate communication with multiple movement (e.g., time of flight) sensors in the threat approach rail 3. The wired connection may include multiple communication wires bound in a single cable or maintained as separate wires or cables. The wires may be shielded or encased.

The RALU 4 is the point where threats as sensed and determined by the one or more processing means or units (e.g., microprocessors) in rail 1 and/or rail 2 are further indicated with a presentation of alert/warning and/or audio alarm sounds (e.g., colored visual alerts via a liquid crystal display ("LCD") or other display unit and/or audible alerts via one or more speakers). The RALU 4 can communicate with the sensor rails 1 or 2 wirelessly via internal radio and antenna 6. In accordance with several embodiments, one sensor rail is the master for purposes of wireless communications with the RALU 4. Wired implementations may also be used. The RALU 4 can include a display (e.g., a touch-screen LCD) configured to receive operator input and to display visible output. The display may include one or more graphical user interfaces, keypads, buttons, switches, or other user input devices.

FIG. 1 also shows a DC power source 7 for the system (e.g., to power sensor rails 1,2 and the threat approach rail 3). The DC power source 7 may be attached (mechanically attached and/or electrically coupled) to one rail, which may be either rail 1 or rail 2, as power can also be relayed throughout the components of the FMD system via the wired connection 5. The RALU 4 can also be used to "over the air" program the one or more processors (e.g., microprocessors) in sensor rail 1 and/or sensor rail 2, as well as for system setup, setting of magnetic threshold and speed of approach, and calibration. The RALU 4 may be programmed or configured to provide various controls (such as controls for prescribing which rail is on the left versus the right of the passageway (e.g., doorway), checking each sensor output, sensitivity and background magnetic field levels, and overall threat detection level as desired and/or required by each particular site). The RALU 4 may also be programmed or configured to set up which of sensors 14 (shown in FIG. 4) is aimed at the door or the passageway entry. The RALU 4 may include one or more processing units (e.g., processors, microprocessors) and memory for storing one or more processing algorithms or program instructions.

Figure 2:
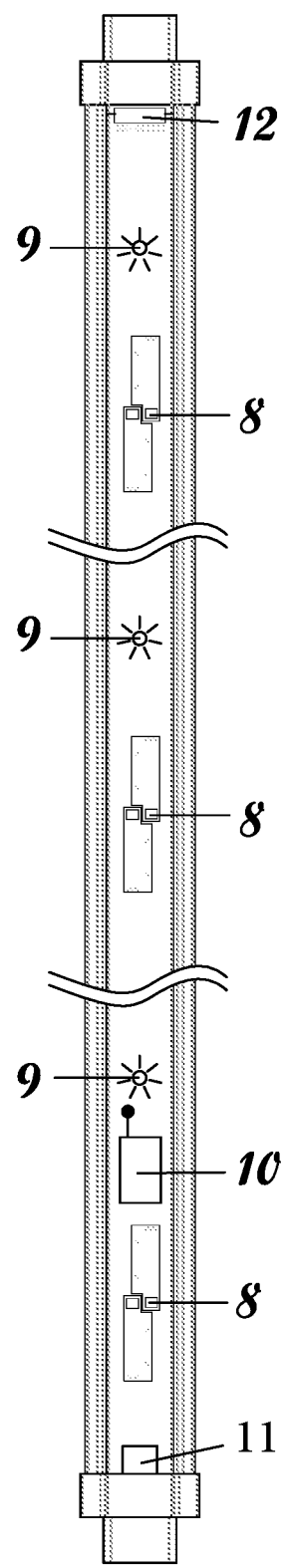
FIG. 2 illustrates an example embodiment of a sensor rail with the first sensor array, for detecting ferromagnetic objects.

FIG. 2 shows details of an example sensor rail (such as rail 1 or rail 2 shown in FIG. 1), which may include three sets of magnetic field sensors 8 (e.g., amorphous magnetic impedance, or AMI field sensors) as single sensors or pairs of sensors. In some embodiments, a sensor rail may include more or less than three sets of magnetic field sensors 8, such as one set, two sets, four sets, five sets, or more than five sets of sensors. The sensors 8 can be mounted at various points along the rail(s) 1, 2 so as to cover the passageway across an average human height dimension from the floor, for example. The sensors 8 can be further arranged in pairs wired and/or oriented differentially for a further increase in sensitivity and reduction of common mode magnetic noise. Such differential connection may be accomplished through physical orientation or electrical connection. Further, in some implementations, a stray background field nulling the DC field may be substituted for one of the paired sensors. The nulling field may be created either via fixed small magnets or actively generated by electric current in a coil wrapped over a suitable core material. In some implementations, the DC field nulling component may include a small ferrite core unshielded inductor with the coil current and so the field is produced and controlled by a manually settable current source. Alternatively, the current source may be controlled by the processing means (e.g., one or more processors or microprocessors) via, for example, a digital-to-analog converter ("DAC") or pulse-width modulation ("PWM") output.

Multiple sets of LEDs 9 (e.g., three-color LEDs) or other light sources for the presentation of passageway status may be included, as shown in FIG. 2. For example, various colors of the LEDs can indicate various statuses of the passageway or threat levels at various locations of the passageway. For example, green can indicate the passage is clear of threats, yellow can indicate that the sensors 8 detect a possible magnetic threat in range, and red can indicate that the threat's speed and direction along with magnetic signal threshold, as adjusted for the speed of approach, qualify as a real threat with confirmation that the threat is passing the passageway directly under threat approach rail 3.

Figure 6:
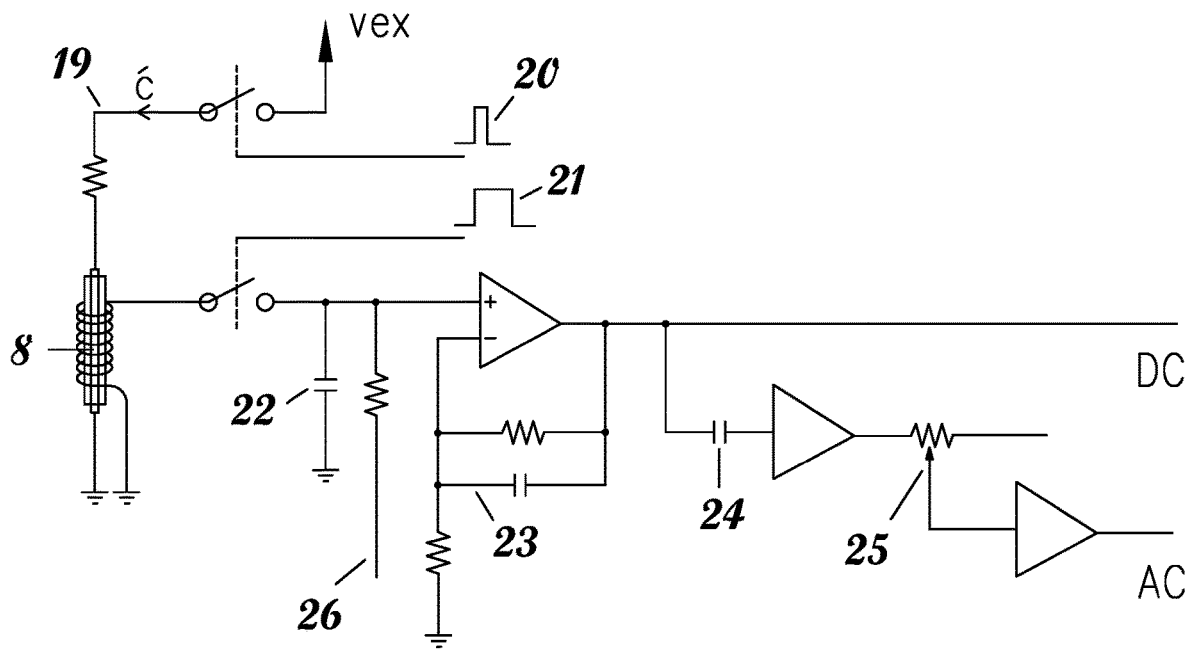
FIG. 6 is a schematic diagram illustrating an example embodiment of signal processing components of a sensor for detecting ferromagnetic objects.
Figure 7:
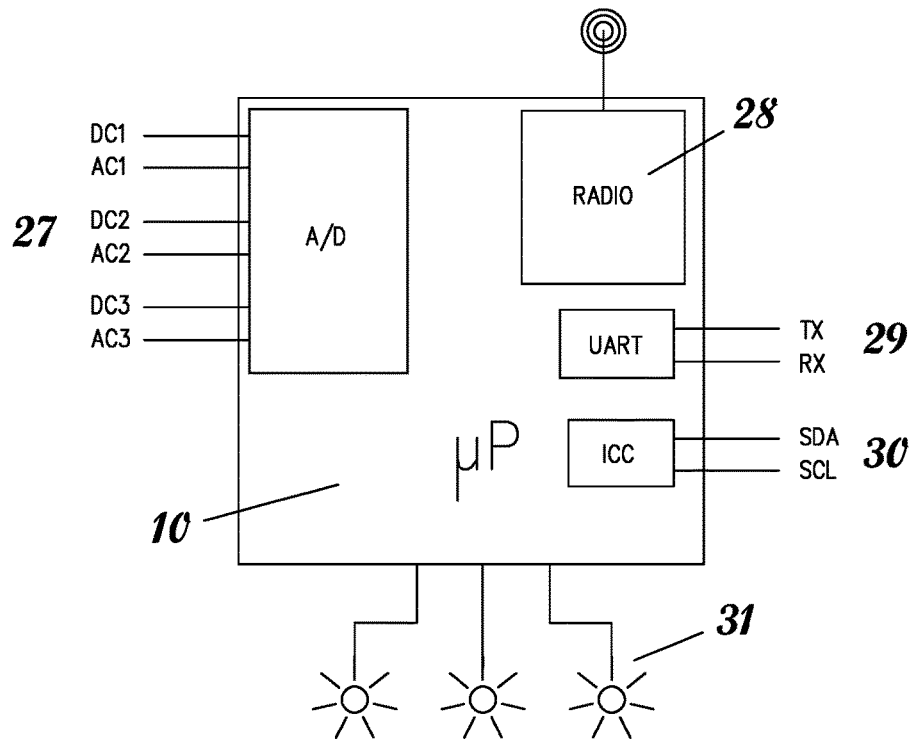
FIG. 7 is a block diagram illustrating an example embodiment of a microprocessor with the means of inputting analog magnetic sensor signals, digital time of flight (TOF) signals, and communication signals (e.g., wireless, wired) of one or more sensor rails.

FIG. 2 also shows a microprocessor 10 with a radio that can be included in one or both of the rails 1, 2, with more detail shown in FIG. 7. Each of the sensor rails 1, 2 can include a power input connection 11, and communications between each sensor rail 1, 2 and the threat approach rail 3 can be made via a respective interface connector 12, which may facilitate mechanical and/or electrical connection (e.g., electromechanical connection). Further, the sensor rails 1, 2 can include analog signal processing circuitry or devices for each sensor 8, which is shown in more detail in FIG. 6.

FIG. 3 shows an example threat approach rail 3 mounted across the top of the passageway (e.g., doorway) and which can include additional LEDs 13 (e.g., tri-color LEDs or dual-color LEDs or single-color LEDs) or other light sources which work together with the sensor rail LEDs 9 or other light sources to indicate passage threats. The threat approach rail 3 can also include six time of flight sensors 14 (or more or less than six time of flight sensors, such as one, two, three, four, five, seven or more than seven time of flight sensors). The TOF sensors 14 may be infrared (IR) based time of flight sensors or other type of motion sensor (e.g., sensor that can sense direction and/or speed of an object). The sensors 14 may comprise a second group of sensors different than a first array of sensors 8 in the rails 1, 2.

FIG. 4 shows further details with respect to the second sensor group or second sensor elements implemented with the TOF sensors 14. In some implementations, six such sensors 14 can be used to cover the passageway, though other numbers may be used depending on the size of the passageway. In some embodiments, one or multiple TOF sensors 14a can be aimed at the door to detect door motion and door open status, and one or multiple TOF sensors 14b can be aimed directly downward to confirm that a threat (e.g., ferrous object) has entered or is about to enter the protected area (e.g., via the passageway), and one or multiple TOF sensors 14c can be aimed outward from the protected passageway. The TOF sensors 14 may be combined with a magnetic sensor rail, or arranged in a separate rail. The TOF sensors 14 may be used in pairs or may be used as single units in various embodiments. The TOF sensors 14 may be singular, or plural, and each sensor 14 may produce TOF signals from a plurality of smaller areas or pixels, making up the sensor's entire field of view. From each pixel, the relative location and speed of objects in the field of view can be gleaned. Further directional information may be derived by tracking between pixels, thus providing two-dimensional information of objects in view. The outward-facing TOF sensors 14c can acquire the two-dimensional (2D) movement (speed and direction) of a potential threat. The direction of view, field of view, and range of each sensor 14 can be programed from the RALU 4 for optimization of performance in actual field locations. A widened field of view and higher resolution of the direction vector can be gained with sensors 14 each employing an array of elements. One configuration utilizes TOF sensors 14, each with a 4×4 sensing array. In several implementations, each pixel of the array provides distance and change in distance (e.g., speed).

Figure 5:
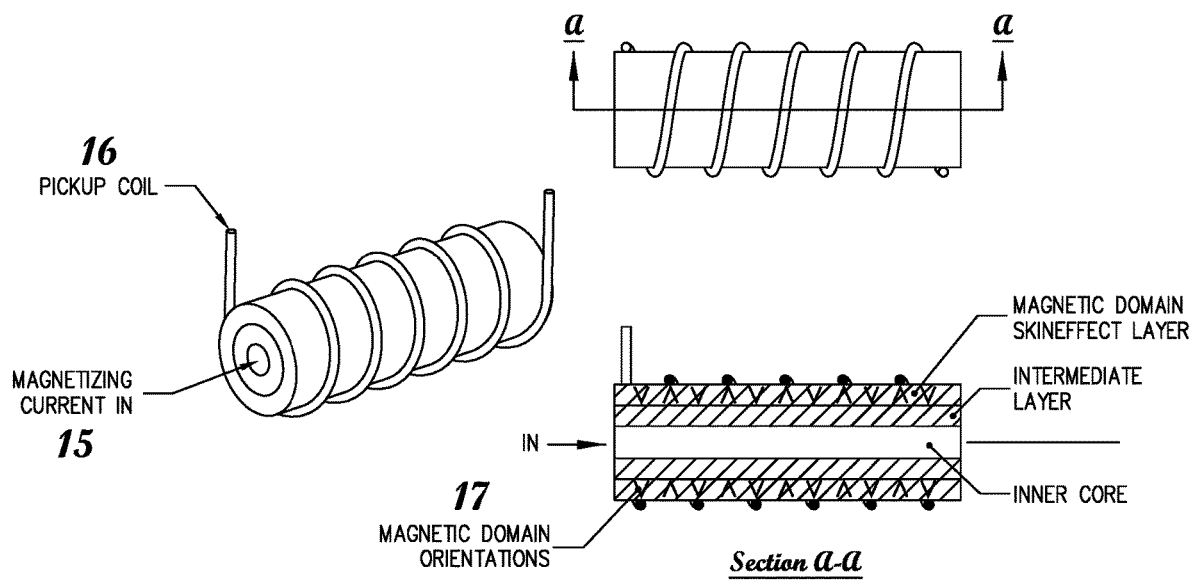
FIG. 5 illustrates an example embodiment of a sensor for detecting ferromagnetic objects.

FIG. 5 illustrates details of the construction of the magnetic sensors 8 showing a core amorphous wire 15 and an outer sense coil 16. The sensor 8 can be made very small with high magnetic sensitivity using, for example, a 3 mm to 8 mm long sense wire 15. Other lengths may also be used. In some implementation, a short pulse (for example, approximately 200 nanoseconds) of magnetizing current is applied or generated on the wire 15 to orient magnetic domains 17 as a skin effect that is sensed by the outer sense coil 16. In accordance with several implementations, the amplitude of the sensed signal is increased in proportion to the ambient magnetic field. FIG. 5 includes a perspective view, a side view, and a cross-section view. As shown in the cross-section view, the wire 15 includes an inner core, an intermediate layer, and a magnetic domain skin effect layer.

FIG. 6 shows one of the sensors 8 and its analog signal processing circuitry. The sensor 8 may be excited by current pulse 19 (e.g., approximately 200 nanosecond current pulse) via a timing pulse 20. A sensor receive coil or outer sense coil 16 is demodulated by an appropriately timed demodulation pulse 21 (e.g., of approximately 500 nanoseconds), and a filter capacitor 22, before a first low pass filter stage 23 and subsequent AC coupling 24 to further manual gain calibration stage(s) 25. Additionally, as the sensor 8 may be extremely sensitive in accordance with several embodiments, a reduction in ambient magnetic fields may also be required to remove the local static magnetic background from the Earth's field and/or that of the MRI stray field. Such a neutralizing of the ambient fields can be electrically introduced at a predetermined circuit location 26.

FIG. 7 shows the detail of an example embodiment of a processor (e.g., a microprocessor) 10 included in one or both sensor rails 1 & 2. The microprocessor 10 receives analog signals from the various amplifiers of the sensors 8 applied to analog to digital (A/D) conversion, as shown in FIG. 7. Both the DC and high gain AC signals can be converted by the multichannel A/D converter from each sensor 8. The microprocessor 10 includes an on-chip radio 28 for communication with the RALU 4 of FIG. 1. The microprocessor 10 also includes an asynchronous serial port 29 (e.g., uART) for communications between sensor rails 1 and 2, as well as an inter-integrated circuit ("I2C" or "ICC") communications port 30 for communications with the time of flight sensors 14 of FIG. 4. The communications port 30 may include serial data ("SDA") and serial clock ("SCL") pins. The microprocessor 10 may also use a general-purpose input/output ("GPIO") 31 for control of various switches and signaling including control of the bank of indicator LEDs 9 on each rail 1, 2 and the LEDs 13 on the threat approach rail 3.

Figure 8:
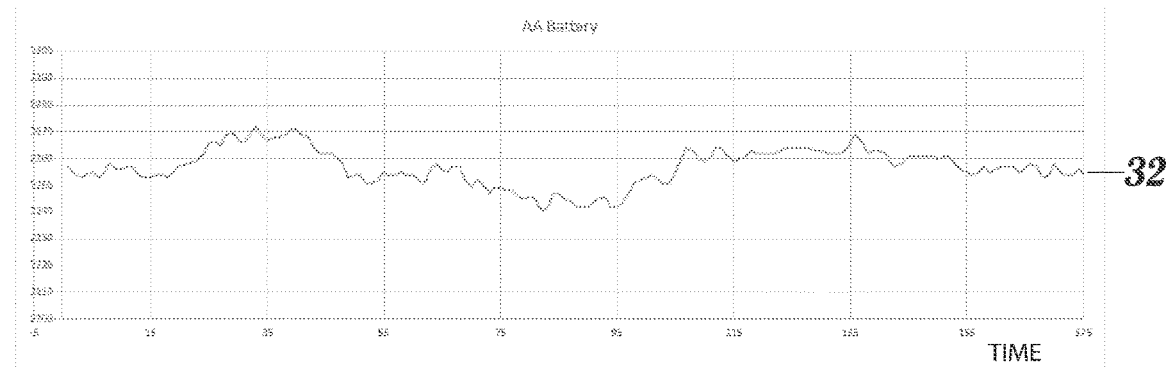
FIGS. 8-10 are graphs illustrating example signals for detecting ferromagnetic objects and determining their threats.
Figure 9:
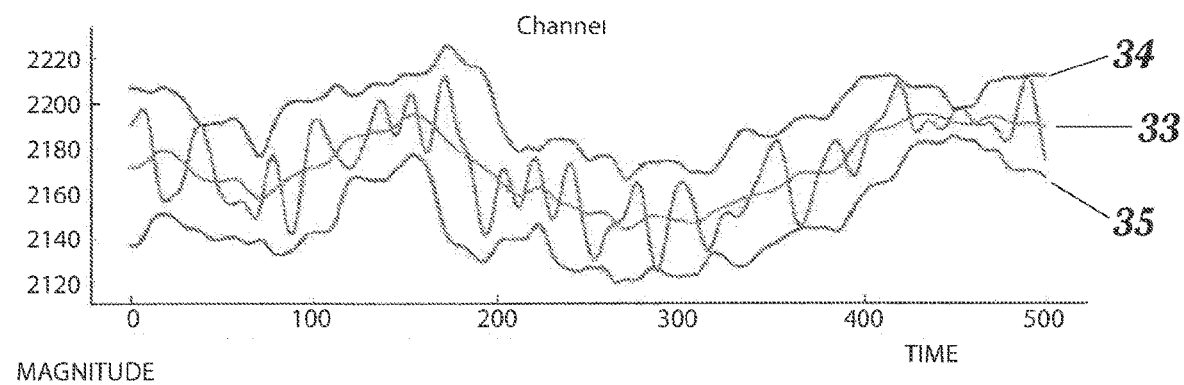
Figure 10:
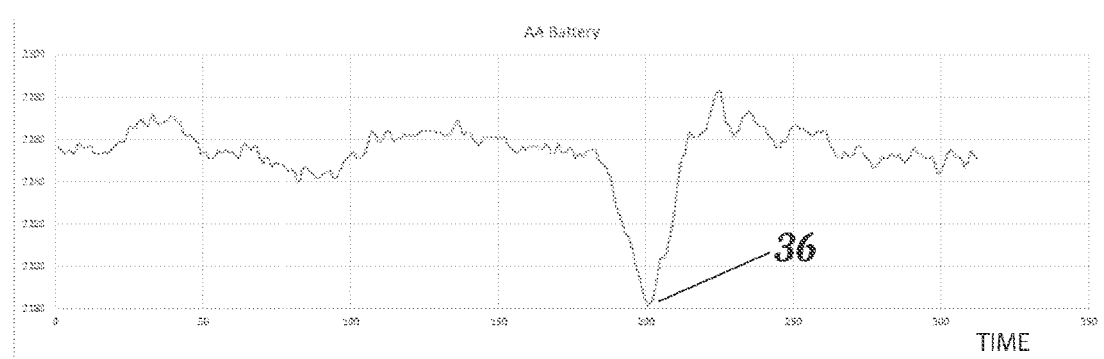

FIGS. 8, 9, and 10 show the operation of an implementation of a signal processing algorithm within the microprocessor 10. FIG. 8 shows an example representation of sampled incoming typical sensor signals 32, which, though analog filtered, still are far too noisy for a reliable, low false alarm, detection. FIG. 9 shows the effect of further bandpass filtering within the microprocessor 10 and the addition of a moving average filter. Additionally, the microprocessor 10 windows the moving average signal 33, with window limits (upper window limit 34 and lower window limit 35) being set at 1 to 3 standard deviations, for example, from the central average 33. Other window limits may be used as desired and/or required.

FIG. 10 shows a possible threat is detected as a signal 36 which breaks out past the moving average standard deviation (SD) window limit at a certain point in time. The possible threat signal 36 is further processed for confirmation of threat by confirmation of direction and threshold adjustment based upon the speed of the approaching object (e.g., based on the time of flight sensors 14). Objects not moving towards the entry are ignored and the final offending amplitude of signal 36 to be confirmed as a threat is modified for the detected speed of approach to the object. These confirming processes are further described below.

Example Implementations of the Ferromagnetic Detection System

The systems and devices described herein for ferromagnetic detection can include multiple magnetic sensors or sensor elements (e.g., highly sensitive amorphous magnetic impedance ("AMI") sensors 8) which can be arranged, for example, in a vertical stack or rail. The vertical stack or rail may be positioned around a passageway (e.g., doorway). In some embodiments, three or more such sensors (e.g., first sensor array) can be used to cover a range from just above the floor to an average shoulder height of a person. As the sensitivity can be highly dependent upon the distance that a ferrous object is located from the sensor elements within a rail, multiple rails (e.g., sensor rails 1, 2) may be required for proper coverage of an area or opening. In some configurations, for protection of a doorway or hallway, two vertical rails placed across from each other can safely cover a 3 to 5 foot wide passage. However, additional rails or longer rails with additional sensors 8 may be used for larger passageways. In accordance with several embodiments, sensor sensitivity is not omnidirectional and sensing elements are optimized for maximum signal detection of objects moving in a horizontal plane parallel with the floor.

To make the rails as unobtrusive as possible, sensors and electronic support circuitry can be small. For example, the size of the sensor element (e.g., sensor 8) can be approximately 4 mm in the longitudinal (sensing) direction and under 2 mm in height; however, other lengths and heights can be used as desired and/or required. Other circuits can include amplification, simple analog filters, A/D conversion, microprocessor processing with digital signal processing ("DSP") capability, and radio system-on-chip ("SOC"). Rails (e.g., rails 1, 2) can also include three colors of LED indicators and, in some embodiments, each indicator can be set near one of the sensing elements. These indicators can be used to present high alerts (e.g., Red color), cautionary alerts (e.g., Yellow color), and all clear indications (e.g., Green color). Further, the rails can be configured to link (e.g., wirelessly) to an external display, data logging, and alarm unit (e.g., RALU 4) for user control, system diagnostics/setup, and logging of threat events such as ferrous object detection.

In some implementations, the ferromagnetic detection system can include a third section, typically to be mounted across the top of the passageway. The third section, or rail, can include (e.g., contain) sensors for the detection of movements and motion of objects (e.g., threat sensor rail 3). Utilizing "time of flight" timed reflected light pulses, these sensors (e.g., time of flight sensors 14) can present signals indicative of the actual 2D vector of objects within their view. The processing algorithms can utilize the direction and magnitude (velocity) of objects in view (e.g., approx. 6 feet) to dynamically, in real-time (e.g., during a time in which the sensing, detecting, analyzing, alerting, etc.) is occurring, adjust trigger thresholds of processed magnetic sensor signals and thus refine alarm triggering. Advantageously, the combination of both the dynamic tracking of magnetic sensor signals and dynamic adjustment of alert trip thresholds using 2D sensor data in combination with the magnetic sensor signals, can increase the reliability of detecting actual threats and so not presenting false threat alerts, thereby advantageously increasing user adoption and trust, enhancing the user experience and enhancing safety for equipment, clinical professionals, and patients.

Utilizing the speed of the magnetic object in combination with the magnetic sensor signals enhances the system's ability to discern threats. As the magnetic sensors are bandpass AC coupled in some implementations, the speed at which a ferrous object moves in close proximity to the sensors, are related to the signal produced by the first magnetic sensor. Ferromagnetic objects moving at very slow or very fast speed produce a relatively small magnetic signal, while the same mass of a ferromagnetic object moving at speeds coinciding closer to the center point of the band pass filtering will produce a larger magnetic signal. Thus, adding a factor for the speed of the object, the sensitivity can be normalized and a more precise alarm threshold achieved.

In accordance with several implementations, the output of the time of flight sensors (e.g., sensors 14) can not only discern 2D vectors of moving objects but also their distance and rate of change with respect to distance, a third dimension. The systems and methods described herein can allocate such time of flight (TOF) sensing to view a space away from the door, such as sensors 14c shown in FIG. 4, and also view the door, such as sensors 14a shown in FIG. 4 (e.g., when the system is installed within a few feet of a door). Information from the door viewing sensor (e.g., 14a of FIG. 4) is presented to the processing algorithms (e.g., to the one or more processors executing the processing algorithms) so that further alert gating may be applied until the door is seen as open, with the further possible inclusion of the amount of opening. Also, as the door moves, this movement can disturb the magnetic sensors, producing an artifactual signal. Knowledge of the movement of the door can be used to further compensate the magnetic sensor output and maintain maximum sensitivity to actual ferrous threats.

A third set of TOF sensors, such as sensors 14b shown in FIG. 4, aimed directly downward can also be utilized as a final confirmation that the approaching object actually is passing the opening.

Further, in some implementations, it may be advantageous to install the system just inside an MRI scan room. In such cases, the electronics which may produce RF noise of a level that can add artifacts to the desired MRI images can be configured to sleep or run at such a low speed as to keep such RF noises below the imaging signal thresholds. By utilizing the door-viewing TOF sensors (e.g., sensors 14a), the electronics can "sleep" until the door is opened at which time the electronics can enter an operation mode comprising normal operation as described herein. Then, further, with added 2D vector knowledge that a moving object is moving out of the MR scan room, further alarm gating can be applied until such time as the 2D vector information indicates an object is moving into the MR scan room.

A description of an example of the magnetic sensor that may be employed in the ferromagnetic detection system is provided. The characteristics described here may be incorporated into the examples described in connection with FIG. 5, and vice-versa. The sensor can be based upon the skin effects of magnetic domains at the outer surface of very small diameter amorphous specialty steel wire. In some implementations, an approximately 30 μm diameter amorphous wire (e.g., 10-50 μm diameter, 20-40 μm diameter, 25-35 μm diameter, overlapping ranges thereof, or any diameter value within the recited ranges) is directly excited by a short 100 to 400 ns pulse, repeating at a 1 to 40 MHz rate, of only a few milliamps which aligns the skin magnetic domains of the wire while never actually magnetizing or saturating the wire. The core of the wire may be unaffected by the short pulse. In various embodiments, different diameters of wire will require and tolerate different pulse widths and repetition rates; however, a rather fine wire can be implemented to reduce (e.g., minimize) size, current, and increase (e.g., maximize) sensitivity.

The length of the amorphous wire can be 4 mm, but 1 mm to 8 mm lengths have been successfully used with sensitivity increasing with length, but with noise increasing also with length.

In some implementations, the external magnetic field in which the excited wire is immersed affects the re-alignment of the magnetic domains of the skin. This is sensed with a sensing coil wrapped around the length of an amorphous wire. Synchronous demodulation of the sense coil output with the excitation pulses can yield a highly sensitive output measurement of the external field. This effect is known as the magneto-impedance effect upon the amorphous wire.

In accordance with several embodiments, the resulting sensor with 4 mm wire yields a sensitivity of 30 mV/µT with noise 0.1 Hz-10 Hz of 240 pT/√Hz and 30 nT p-p. Such sensitivity and the noise floor is far better than Hall-effect or fluxgate sensors. For example, the best linear output Hall-effect (resistive change due to field) sensors have been found to have sensitivities of 100 µV/µT, which is some 300 times less sensitive, and 500 times noisier. Today's best fluxgate sensors have been found to offer noise of 1.5 nT/√Hz and sensitivities of no better than resolving 4 nT, both about 200 times less than the amorphous wire MI sensor described herein.

The Earth's field (which is not equal at all locations and is changing) may affect the high sensitivity amorphous wire sensor (e.g., AMI sensor) 8. The Earth's field is typically 0.8 G representing a significant "DC" offset to the sensor. Given that the sensor's fundamental noise is the practical limit of gain which can be applied, this AMI sensor design permits the application of significant gain as the fundamental sensor's noise floor permits much usable amplified signal. However, the DC component can push the amplified signal into the rails of the operational amplifiers (op-amps) employed, especially with high levels of DC of gain. Therefore, it may be advantageous to compensate, in the field during installation, an offset adjustment to maintain the maximum signal head room. This DC compensation can be directly in the signal chain close to the first amplification nearest the sense coil. Such may be required in various places around the Earth, with various orientations N-S vs E-W, and with other background DC fields such as residual magnetism of the nearby building structures or the stray field of the MRI itself, all of which are effects the existing designs provided by others described above not only cannot use but would seek to eliminate or null out.

In accordance with several embodiments, the low noise floor of Applicant's magnetic sensors described herein advantageously allows for high AC gain without having the noise of the sensor adding to the complication of normal background environmental magnetic noise. Bandwidth limiting in the front-end amplification can further limit the amount of sensor noise and environmental noise may be reduced. From the initial amplification stage with a gain of approximately 5 times where the Earth's DC field can be compensated out, then with a band limiting to 0.3 Hz to 10 Hz, an additional gain of approximately 300 to 500 can be applied to the sensor 8. This may result in usable detectable signals to as small as 1000 V/G or less than 100 nT/V, with A/D resolution providing sensitivity to below 100 pT/count.

The environment presents noise well above the detection floor. Electrical noise from motors starting, such as elevators or even water coolers, presents thousands of pT or hundreds of A/D counts. The opening of a steel file drawer or movement of a chair can create a huge disturbance to the static fields and result again in large signals to the A/D. Such signals are transitory and in the band of interest, so conventional filters are of very limited use. In accordance with several embodiments, the FMD system described herein employs a dynamic tracking filter method, which is further adapted in real time with the 2D vector signal from the TOF sensors (e.g., sensors 14).

Example Implementations of Processing Techniques

With basic gain and filtering applied to each sensor via analog circuits, such bandwidth obtained is approximately 3 Hz to 10 Hz with a gain of 300 to 500. In some implementations, the analog-to-digital conversion ("ADC") samples each sensor amp outputs both as DC and after bandpassing and gain at 2000 Hz and further filters the high gain bandwidth limited signals in software using a direct form II biquad cascade filter. In some implementations, the filter is a low pass, 10 Hz, 5th order filter which is used to reduce sensor noise and unnecessary fast signal changes which are beyond those expected from the speed at which a human may move a ferrous threat past the sensors. The filtered signal may be further down-sampled to 50 Hz, which produces the final magnetic signal that is processed by the following algorithms.

In accordance with several implementations, the threat detection algorithm cannot simply measure the difference in the value of the magnetic field from a datum with a constant threshold because the change in the magnetic field due to ferrous objects moving through the field is not univariate. Through observation, the change in the magnetic field measured by the amorphous wire sensors is at a minimum based on the velocity of the incoming object. This is not necessarily the only factor, as the shape and orientation of the object may affect the signal level output. But because of this relationship to the speed of the object, it may be advantageous to measure the change in the signal, rather than the magnitude of the signal. This measurement may be accomplished by calculating the sum of the slopes of the N most recent samples and comparing this value to a threshold. The threshold may be determined in real time based upon the 2D vector of the movement of the object as determined by the TOF sensors (e.g., sensors 14). In some implementations, slopes of the AC-coupled and filtered magnetic detector signals are calculated sample to sample, meaning as a new sample is received, the difference in value is measured compared to the previous sample. This change may be stored in a buffer of length N, and the sum of that buffer is the "slope sum" at any given time. The "slope sum" value may be compared to the current threshold. This value may be notated as follows:

$$SS_N = \mathrm{ABS}\sum_{i=1}^{N} |x_N| \text{ where } x_N = s_{newest} - s_{previous}$$

The threshold that the slope sum value is compared to may be determined by the speed at which an object is approaching the magnetic sensors (e.g., sensors 8). The speed may be calculated using the distance values received from the forward-facing time-of-flight infrared sensors (e.g., sensors 14c) in the top rail 3. In some implementations, the velocity is calculated sample by sample. In other words, when a sample is received, the difference in value is taken compared to the previous sample. This value, in mm per sample, may be saved in a buffer of M velocities. Based on the average of this buffer, the actual threshold used upon the magnetic sensors signals processed above may be represented by the following:

$$T_{mag} = \begin{cases} 100ADC\frac{\text{count}}{\text{sample}}; & \text{if } v_M < 30\frac{\text{mm}}{\text{sample}} \\ 120; & \text{if } v_M \geq 30 \text{ and } v_M < 35 \\ 140; & \text{if } v_M \geq 35 \text{ and } v_M < 40 \\ 160; & \text{if } v_M \geq 40 \text{ and } v_M < 45 \\ 180; & \text{if } v_M \geq 45 \end{cases}$$

In some implementations, the baseline magnetic threshold is 100 ADC counts per sample. When the threshold is adjusted, it may be adjusted for a constant time to allow for the approaching object to reach the magnetic sensors (e.g., sensors 8) before being adjusted back to the baseline threshold. In some implementations, there are 6 magnetic sensors in the ferromagnetic detector system, 3 per sensor rail. We can call the state of any sensor MDs, where s is the sensor being evaluated. If at any point the value of the slope sum, $SS_n$, becomes greater than $T_{mag}$, the processing algorithm (upon execution by one or more processors) may determine that the sensor has detected a ferromagnetic object.

Metal detected=$SS_n$>$T_{mag}$

Based on this value and other values calculated using the infrared time of flight sensors (e.g., sensors 14), the ferromagnetic detector system's logic (e.g., in RALU 4 or in the microprocessor 10) can determine the correct time to alarm.

In accordance with several implementations, the threshold that the slope sum is compared to is determined by the speed (velocity) at which an object is approaching the magnetic sensors (e.g., sensors 8). In some implementations, the velocity is first converted to a percent in terms of a maximum walk gate speed (e.g., 1.0 m/s). This percent may then be multiplied by a user-adjustable value known as a speed of approach factor to determine the velocity-modified constant. When the velocity is at a maximum, so is the velocity modifier; when the velocity is at a minimum, the velocity modifier is set to its minimum value of 1. The velocity modifier may be multiplied by a user-adjustable base threshold value (e.g. that may range from 30 to 300) to get the final threshold to which the slope sum is compared.

Other embodiments may use more or less AMI magnetic field sensors (e.g., sensors 8), magnetic sensors of different technologies or sensors arranged such that they cancel background noise and/or increase their combined sensitivity. For the measurement of the 2D vector, speed, and direction, various other types of sensors could be utilized. In some implementations, the TOF sensors (e.g., sensors 14) rely on the time of flight of pulsed IR light and so are akin to radar which would use high-frequency RF pulses. The use of the timed reflection of sound pulses, akin to sonar, may also be of use to determine 2D movements.

In accordance with several implementations, by adding a second AMI sensor out of phase and physically near each singular location of the sensors, the sensor pairs themselves can supply direction information. Such a twined sensor arrangement in differential connection also can reduce the noise floor, thus increasing detection sensitivity and reducing extraneous environmental effects further.

Example Process for Detecting Ferromagnetic Objects and Generating Alerts

Figure 11:
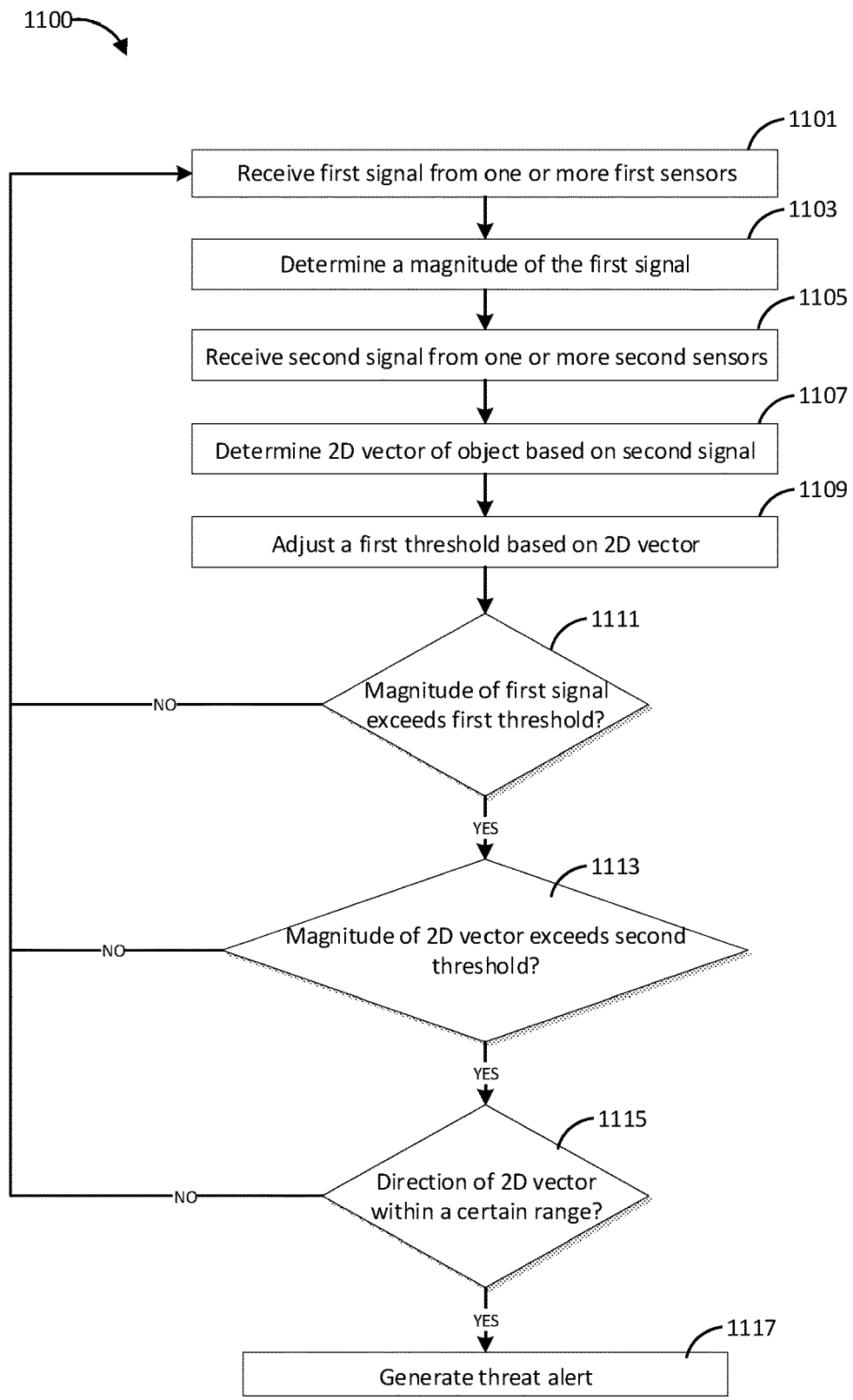
FIG. 11 is a flowchart illustrating an example process for detecting ferromagnetic objects and determining their threats.

FIG. 11 is a flowchart illustrating an example process 1100 for generating an alert based on ferromagnetic detection and threat analysis. Process 1100 or portions thereof may be executed by one or more computing devices performing computer-readable processing tasks or instructions that are stored in memory either in parallel or in series. The one or more computing devices may include one or more processors (e.g., microprocessor(s) 10 or a processor or microprocessor within RALU 4) in communication with sensors (e.g., sensors 8, 14) of the ferromagnetic detection systems as described herein. At block 1101, a processor may receive a first signal from one or more first sensors. The first sensors may comprise one or more magnetic field sensors such as sensors 8 described with reference to FIG. 1, for example. At block 1103, the processor may determine a magnitude of the first signal, which may indicate the strength of the magnetic field detected by the one or more first sensors, which, in turn, may correlate with a size of an object detected. For example, a first signal with a large magnitude may indicate that a large ferromagnetic object has been detected by the one or more first sensors, while a first signal with a small magnitude may indicate that a small ferromagnetic object has been detected by the one or more first sensors.

If multiple first sensors are used, the magnitudes of the signals of the first sensors can also be compared to estimate the location of the ferromagnetic object (e.g., by assuming the location of the detected object is closest to the first sensor with the largest signal magnitude). The location of the ferromagnetic object can be shown by an alert or precautionary warning or indicator (e.g., blinking of an LED) nearest to the first sensor that has the largest signal magnitude. In some implementations, the location can be shown only if the system has "large" confidence. A large confidence in the location of the ferromagnetic object may be determined, for example, if the difference between the signal magnitude of the first sensor is at least 25% greater than the signal magnitudes of the other first sensors (or at least the smallest magnitudes of the other first sensors).

At block 1105, the processor may receive a second signal from the second sensor or second sensor group. The one or more second sensors may comprise sensors for detecting motion and/or distance of objects. For example, the one or more second sensors may comprise IR based Time of Flight sensors 14 such as described with reference to FIGS. 3 and 4. The second signal may include information relating to a 2D vector of a detected object, such as a ferromagnetic object approaching a passageway (e.g., doorway). The 2D vector may include information relating to the magnitude of the velocity and the direction of the velocity of the object. At block 1107, the processor may analyze the second signal to determine the 2D vector and/or to determine the magnitude of the velocity and/or direction of the velocity of the object.

At block 1109, the processor may adjust a first threshold based, at least in part, on the 2D vector of the object (e.g., magnitude of the velocity and/or direction of the velocity of the object). For example, the processor may raise the first threshold (e.g., lowering the chances of triggering an alert) for detected objects with small magnitudes of velocity and/or for detected objects whose direction of velocity is pointed away from a passageway (e.g., doorway or other entryways). As another example, the processor may lower the first threshold (e.g., increasing the chances of triggering an alert) for detected objects with large magnitudes of velocity and/or for detected objects whose direction of velocity is pointed toward a passageway, for example within a certain range of degrees (e.g., the direction of velocity is within (less than) 45 degrees of orthogonal to the passageway). Other ranges may be used (e.g., less than 50 degrees of orthogonal, less than 40 degrees of orthogonal, less than 35 degrees of orthogonal, less than 30 degrees of orthogonal).

In some implementations, the processor may determine the distance of the detected object from the passageway, for example, based on information in the second signal. The processor may adjust the first threshold based on the distance of the object from the passageway. For example, the processor may raise the first threshold if the object is far away from the passageway (e.g., greater than a predetermined first distance) and may lower the first threshold if the object is close to the passageway (less than a predetermined second distance).

At block 1111, the processor may determine whether the magnitude of the first signal exceeds the first threshold and if so may proceed to block 1113. Otherwise, the process 1100 may return to block 1101.

At block 1113, the processor may determine whether a magnitude of the 2D vector (e.g., magnitude of the velocity of an object) exceeds a second threshold and if so, may proceed to block 1115. Otherwise, the process 1100 may return to block 1101.

At block 1115, the processor may determine whether a direction of the 2D vector (e.g., the direction of the velocity of an object) is within a certain range (e.g., sufficiently directed or pointed toward a passageway) and if so, may proceed to block 1117. Otherwise, the process 1100 may return to block 1101.

At block 1117, the processor may generate an alert indicating a threat potential of a ferromagnetic object passing through the passageway. The alert may include activating one or more LEDs or light sources. The alert may be one or more colors depending on the level of severity of the threat if the LEDs or other light sources are capable of displaying different colors. In some embodiments, the threat may be output to a display. The alert may include an audible alert in some embodiments. The first signal may comprise multiple first signals from one or more of the first sensors and the second signal may comprise multiple second signals from one or more of the second sensors.

Example Implementations for Determining Door Position and Door Movement

In some implementations, the second sensor group (e.g., one or more of sensors 14) may produce an additional signal that relates to the distance (nominal distance or angular distance) between the second sensor group and a door within the passageway. In some implementations, the system is configured to determine the distance and estimate the door's angular position when at rest, thereby "learning" the closed-door position, or the position of the door when the door is closed.

The method of producing an additional signal that estimates the door's angular distance can be determined by using the distance from the second sensor group 14 to the doorway. The angular distance can be estimated by using trigonometric equations to calculate the angular distance from the second sensor group nominal distance, as well as mapped door distance values that were previously taken during calibration/learning steps that include points when the door is completely closed, or opened at a 45 degree position or other degree positions.

In some implementations, the second sensor group may be used to determine if the door position is opened or closed by determining if the door distance relative to the second sensor group (e.g., nominal distance or angular distance) is smaller than a limiting threshold based upon the learned closed-door position. A determination can be made if the door is sufficiently closed to prevent the entry of a person or hazardous-sized objects. Or if the threshold is crossed with increasing distance, as determined by second sensor group distance growth, it can be determined that the door is sufficiently open to allow entry of a person or hazardous-sized object.

A method of determining if the door is opened or closed can be implemented by first determining or learning a door-closed threshold in a calibration process and then adding a small constant to this value as hysteresis, which may ensure that subsequent door close actions are always detected. The door open threshold can be determined by adding a small constant to the door-closed threshold. Methods of detecting if the door is open or closed may be performed by means of nominal distance or angular distance. If the door position (e.g., based on determining nominal distance or angular distance measurements) is smaller than the closed-door threshold, then the door may be considered closed. If the door position is larger than the open-door threshold, then the door may be considered open. If the door position is between the open-door and closed-door states, the door state may not change from the previously-determined state.

A method of determining the door's angular distance can be implemented by using the distance of the door at a set point, measured by the second sensor group (e.g., one or more of sensors 14). The angular distance can be estimated by using trigonometric equations to calculate the angular distance from the second sensor group and door distance values determined during the calibration or learning process of the closed-door and open-door positions.

In some implementations, the second sensor group may be used to determine if the door is moving by calculating the velocity of the door in motion. For example, by using the distance of the door relative to the second sensor group (nominal distance or angular distance), a processor can determine if the door is in motion. A method of determining if the door is in motion (i.e., moving) can be performed by calculating if the absolute value of the change in distance over a period of time (e.g., a period of time between 10 milliseconds and 3 seconds) is larger than a set threshold.

Example Implementations for Reducing False Alerts or Alarms

In some implementations, a method (such as the methods described herein) may include gating the alarm signal only when the door is open or open beyond a programmed threshold. For example, the ferromagnetic detection system may not generate alarms when the door is determined to not be sufficiently open, to still be in motion, or to be closed.

In some implementations, the method may comprise gating the signal output of the sensor(s) (e.g., sensors 8) nearest to the door handle or doorknob (e.g., when the door is closed or moving). Gating the signal output from these sensor(s) may reduce false alarms caused by ferrous metal that may be located in the doorknob or door handle.

In some implementations, the method may include raising a threshold alarm level for the sensor(s) located nearest to the door handle or doorknob (e.g., when the door is closed or moving). The increase in the threshold alarm level can reduce false alarms caused by ferrous metal that may be located in the doorknob or door handle.

A method of reducing false alarms caused by ferrous metal in the doorknob or door handle while the door is in motion can be realized by running a calibration or learning process. The calibration or learning process determines the maximum ferrous sensor output and gates the signal. Acquiring the maximum ferrous sensor signal output, the sensor with the largest signal output determines the maximum output value while the doorknob or door handle is swiftly moved several times. When the door is determined as closed by other signals, the ferrous sensor output signal (e.g., the output of sensors 8) can be ignored during the consideration of whether to alarm to reduce false alarms.

False magnetic signals can also be generated by current flowing between circuits on the sensor rail 1, 2. Changing currents (e.g., flashing LEDs) are magnetic signals that the magnetic field sensors may detect. Additional circuits to control such switched currents are necessary to avoid creating a false magnetic signal. One method is to maintain constant current flow in conductors, which can be switched to the intended load (e.g., LED) and back to a simple resistive load.

Example Implementations for Noise Detection and Noise Filtering

In some implementations, a method (such as the methods described herein) may comprise filtering out stagnant objects that have no motion (e.g., doorframe, floor, carts, cabinets, etc.). For example, the filtering may include utilizing high pass filtering selectively applied to the second signal (e.g., the signal output by one or more second sensor group 14) or portions of the second signal, such that objects with distances that have no change are not considered in motion detection processing.

The method of filtering out stagnant objects that have no motion can be implemented, for example, through the use of a high pass filter applied to the second signal (e.g., signal output by one or more second sensor group 14). The filtering can be performed adaptively by using digital signal processing techniques such as a digital biquad filter with coefficients designed from a 4th order Butterworth high-pass filter with a cutoff frequency of 0.005 Hz, for example.

In some implementations, the method may comprise filtering out noise caused by stationary objects through a calibration or learning process which maps the environment (e.g., a door frame). The mapped environment can be used to process the distance of an object and determine if the object is stationary, or if the object is in motion, to determine if the object detected is a possible threat. Distance values can be compared against the learned map to determine if detection is relevant to use a motion vector of a possible threat from the second signal (e.g., signal from one of the sensors 14).

The method of filtering out stationary objects can be realized by performing a calibration or learning process that records distances obtained from the signals of the second sensor groups (e.g., TOF sensors 14) when no object is present. When the ferromagnetic detection system is running, distance values larger than the mapped distances (with an additional optional constant added) may be ignored such that the stationary objects are not determined to be threats that cause alerts or alarms to be generated.

In some implementations, the method may comprise filtering out noise caused by partially detected stagnant objects by determining noisy regions in the field of view of the secondary sensor and adding a noise floor threshold such that the noise is not considered. Such noise floor may be added to the entire output of a second sensor group or only to limited regions in the field of view of the second sensor group.

A method of filtering out noise caused by partially detected stagnant objects can be realized by determining a noise floor threshold. For each region in a second sensor group field of view, that is the distance value output, distance values can be considered noise if such distance value is similar to the noise floor plus a small constant. Distance values can also be considered as noise if such distance value does not remain stable for a certain time period (e.g., approximately 1000 milliseconds or for a certain number of consecutive samples (e.g., 15 consecutive samples). When consecutively seen, the signal is not considered noise, but rather a true object. In some implementations, the noise floor threshold can be regulated by proposing to raise or lower the threshold under one or more conditions. First, a new larger noise threshold may be proposed by a sample that is less than the distance of the current noise floor. If after a certain amount of time (e.g., 5 seconds), a higher sample is seen for a certain ration or percentage or duration of this window (e.g., at most 0.6 seconds of the window), the noise threshold may be raised to the smallest distance seen during this time period. If no noise within another longer period of time (e.g., 15 seconds) is seen, the noise floor may be lowered to the value of the smallest distance seen during the longer period of time (e.g., last 15 seconds) with the addition of a small constant.

Example Implementations of Object Point on Coordinate System

A method of determining the 2D vector of the movement of an object can be calculated by using the distances received from the TOF second sensors (e.g., sensors 14). First, the method may involve calculating the coordinates of an object in a reference coordinate system. In some implementations, each TOF second sensor produces distance values for each region of a 4×4 viewing grid within each sensor's total field of view. Each region, or pixel, can be thought to represent a static ray between the sensor, mounted high, and the floor to which it is aimed at. When an object is present, vector projection mathematics can be used to extract coordinate data (X, Y, and Z values) of the point of contact between the object and the ray. The object's center can be calculated by averaging together the coordinates of all points of contact, while applying coordinate offsets with respect to the position of the sensor itself in reference to a reference point (e.g., the center of the doorframe). To determine the distance with higher accuracy, time convolution may be used to weigh each contact point based on the time of the last contact, with respect to the average of the points. A weight of 1 may be used if the point of contact is currently present, or if it occurred within the last 0.75 seconds. In some implementations, a weight of $$\frac{(1.5-t)}{0.75},$$

where t is the time in seconds since the point of contact occurred, is used if the point of contact occurred within the last 1.5 seconds. In some implementations, a weight of 0 is used if there is no point of contact, or if the point of contact occurred longer than 1.5 seconds ago.

A method of determining the 2D vector of the movement of an object can be accurately calculated by performing a moving average of the coordinates, detected from the object within the last 0.5 seconds. A separate moving average can be calculated for the coordinate values within the last 0.5-1.0 seconds. Subtracting the two moving averages and multiplying the result by a determined constant may result in an accurate determination of the 2D vector movement of an object.

Methods of distance and motion information extraction from the door or an object can be extracted by TOF sensors that only report one distance value or multiple values. Methods of motion information extraction may occur directly from the second sensors (e.g., TOF sensors or sensors 14). For example, the second sensors may internally calculate motion from the distance. The methods may also use gesture detection from the second sensors (e.g., sensors 14) to observe patterns of motion.

In some embodiments, methods of motion information extraction may or may not use other coordinate systems such as polar coordinates, or other linear and non-linear coordinates to determine the distance and/or velocity of the object.

Conclusion and Terminology

As used herein, "system," "instrument," "apparatus," and "device" generally encompass both the hardware (for example, mechanical and electronic) and, in some implementations, associated software (for example, specialized computer programs for graphics control) components.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Each of the processes, methods, and algorithms described in the preceding sections may be embodied in, and fully or partially automated by, code modules executed by one or more computer systems or computer processors including computer hardware. The code modules may be stored on any type of non-transitory computer-readable medium or computer storage device, such as hard drives, solid state memory, optical disc, and/or the like. The systems and modules may also be transmitted as generated data signals (for example, as part of a carrier wave or other analog or digital propagated signal) on a variety of computer-readable transmission mediums, including wireless-based and wired/cable-based mediums, and may take a variety of forms (for example, as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, for example, volatile or non-volatile storage.

Many other variations than those described herein will be apparent from this disclosure. For example, depending on the embodiment, certain acts, events, or functions of any of the algorithms described herein can be performed in a different sequence, can be added, merged, or left out altogether (for example, not all described acts or events are necessary for the practice of the algorithms). Moreover, in certain embodiments, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm elements described in connection with the embodiments disclosed herein can be implemented as electronic hardware, computer software, or combinations of both. To clearly illustrate this interchangeability of hardware and software, various illustrative components, blocks, modules, and elements have been described herein generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various features and processes described herein may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

The various illustrative logical blocks and modules described in connection with the embodiments disclosed herein can be implemented or performed by a machine, such as a general-purpose processor, a digital signal processor ("DSP"), an application-specific integrated circuit ("ASIC"), a field programmable gate array ("FPGA") or other programmable logic devices, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable devices that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. For example, some, or all, of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the embodiments disclosed herein can be embodied directly in hardware, in a software module stored in one or more memory devices and executed by one or more processors, or in a: combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or non-volatile. The processor and the storage medium can reside in an ASIC. The ASIC can reside in a user terminal. In the alternative, the processor and the storage medium can reside as discrete components in a user terminal.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, and so forth, may be either X, Y, or Z, or any combination thereof (for example, X. Y. and/or Z). Thus, such disjunctive language is not generally intended to, and should not, imply that certain embodiments require at least one of X, at least one of Y, or at least one of Z to each be present.

Any process descriptions, elements, or blocks in the flow diagrams described herein and/or depicted in the attached figures should be understood as potentially representing modules, segments, or portions of code that include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A working in conjunction with a second processor configured to carry out recitations B and C.

All of the methods and processes described herein may be embodied in, and partially or fully automated via, software code modules executed by one or more general-purpose computers. For example, the methods described herein may be performed by the computing system and/or any other suitable computing device. The methods may be executed on the computing devices in response to the execution of software instructions or other executable code read from a tangible computer-readable medium. A tangible computer-readable medium is a data storage device that can store data that is readable by a computer system. Examples of computer-readable mediums include read-only memory, random-access memory, other volatile or non-volatile memory devices, CD-ROMs, magnetic tape, flash drives, and optical data storage devices.

In general, the processors described herein (e.g., microprocessors 10) may be embodied as a single processor, or as a cooperatively networked or clustered set of processors. The functionality of these processors may be implemented solely in hardware, e.g., using one or more fixed-function or general-purpose integrated circuits, Application-Specific Integrated Circuits (ASICs), and/or Field-Programmable Gate Arrays (FPGAs). Alternatively, this functionality may be implemented at least partly in software. For example, any one of the processors may be embodied as a programmed processor comprising, for example, a central processing unit (CPU) and/or a Graphics Processing Unit (GPU). Program code, including software programs, and/or data may be loaded for execution and processing by the CPU and/or GPU. The program code and/or data may be downloaded to the processor(s) in electronic form, over a network, for example. In some embodiments, the program code and/or data may be provided and/or stored on non-transitory tangible media, such as magnetic, optical, or electronic memory. Such program code and/or data, when provided to the processor(s), produce a machine or special-purpose computer, configured to perform the tasks described herein. The processors may perform tasks in parallel or separately in various configurations.

In some embodiments, the system comprises various features that are present as single features (as opposed to multiple features). For example, in one embodiment, the system includes a single sensor rail, a single threat sensor rail, a single sensor array, a single processor, a single display, a single sensor, a single RALU, a single radio, a single power connector, etc. Multiple features or components are provided in alternate embodiments.

It should be emphasized that many variations and modifications may be made to the herein-described embodiments, the elements of which are to be understood as being among other acceptable examples. All such modifications and variations are intended to be included herein within the scope of this disclosure. The section headings used herein are merely provided to enhance readability and are not intended to limit the scope of the embodiments disclosed in a particular section to the features or elements disclosed in that section. The foregoing description details certain embodiments. It will be appreciated, however, that no matter how detailed the foregoing appears in text, the systems and methods can be practiced in many ways. As is also stated herein, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Those of skill in the art would understand that information, messages, and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

What is claimed is:

1. A system for detecting ferromagnetic objects and analyzing the threat of said objects becoming projectiles as they pass through a passageway, the system comprising:
   a first sensor array comprising one or more magnetic field sensors configured to secure to one or more portions of the passageway, wherein the first sensor array is configured to:
      generate a first signal in response to detecting a magnetic field indicating the presence of a ferromagnetic object in proximity to the first sensor array; and
      output said first signal;
   a second sensor group configured to secure to a top portion of the passageway, wherein the second sensor group comprises:
      a first pair of sensors configured to face toward a portion of the passageway to detect a motion of a door portion of the passageway or a motion of an object passing through the passageway;
      a second pair of sensors configured to face in a downward direction for detecting a motion of objects approaching the passageway; and
      a third pair of sensors configured to face away from the passageway for detecting a motion of objects,
   and wherein the second sensor group is further configured to:
      generate a second signal in response to an object moving relative to the passageway and in proximity to the passageway; and
      output said second signal, wherein said second signal comprises information relating to a velocity of the object and a direction of motion of the object relative to the first sensor array; and
   a processor in communication with the first sensor array and second sensor group, the processor configured to:
      receive the first signal from the first sensor array;
      determine a magnitude of the first signal;
      receive the second signal from the second sensor group;
      determine the velocity of the object relative to the passageway and the direction of motion of the object relative to the passageway; and
      generate an alert indicating a threat level of the object passing through the passageway, wherein the threat level is based, at least in part, on the magnitude of the first signal, the velocity of the object and the direction of motion of the object, and
   wherein the first sensor array, the second sensor group and the processor are each configured to:
      enter a sleep-mode in response to the first pair of sensors detecting the door portion of the passageway being in a closed state; and
      enter an operation-mode in response to the first pair of sensors detecting the door portion of the passageway being in an open state.

2. The system of claim 1, wherein the first sensor array comprises:
   a first sensor grouping configured to secure to a first frame portion of the passageway, wherein the first sensor grouping comprises:
      a first magnetic field sensor configured to secure to a top portion of the first frame portion;
      a second magnetic field sensor configured to secure to a middle portion of the first frame portion; and
      a third magnetic field sensor configured to secure to a bottom portion of the first frame portion; and
   a second sensor grouping configured to secure to a second frame portion of the passageway, wherein the second sensor grouping comprises:
      a fourth magnetic field sensor configured to secure to a top portion of the second frame portion;
      a fifth magnetic field sensor configured to secure to a middle portion of the second frame portion; and
      a sixth magnetic field sensor configured to secure to a bottom portion of the second frame portion.

3. The system of claim 1, wherein the system comprises a plurality of light emitting diodes (LEDs) configured to secure to the passageway and emit light of one or more colors, wherein each of the one or more colors indicates a unique status of the alert, wherein the statuses of alert comprise (1) no threat, (2) potential threat, (3) actual threat.

4. The system of claim 1, wherein the system comprises a display in communication with the processor and wherein the processor is configured to output the generated alert to the display.

5. The system of claim 1, wherein the sensors of the second sensor group are configured to not use magnetic field fluctuations.

6. The system of claim 1, wherein the second signal further comprises information relating to a distance between the object and the passageway and wherein the processor is configured to determine said distance.

7. The system of claim 1, wherein the sensors of the second sensor group are AC-coupled.

8. The system of claim 1, wherein the alert is based, at least in part, on the door portion of the passageway being in the open state.

9. The system of claim 1, wherein a direction of view, a field of view, and a range of the second sensor group are programmable for optimization of performance based on an actual field location.

10. A system for detecting ferromagnetic objects and analyzing the threat of said objects becoming projectiles as they pass through a passageway, the system comprising:
    a first sensor array comprising one or more magnetic field sensors configured to secure to one or more portions of the passageway, wherein the first sensor array is configured to:
       generate a first signal in response to detecting a magnetic field indicating the presence of a ferromagnetic object in proximity to the first sensor array; and
       output said first signal;
    a second sensor group configured to secure to a portion of the passageway, and wherein the second sensor group is further configured to:
       generate a second signal in response to an object moving relative to the passageway and in proximity to the passageway; and
       output said second signal, wherein said second signal comprises information relating to a velocity of the object and a direction of motion of the object relative to the first sensor array; and
    a processor in communication with the first sensor array and second sensor group, the processor configured to:

receive the first signal from the first sensor array;
determine a magnitude of the first signal;
receive the second signal from the second sensor group;
determine the velocity of the object relative to the passageway and the direction of motion of the object relative to the passageway;
generate an alert indicating a threat level of the object passing through the passageway, wherein the threat level is based, at least in part, on the magnitude of the first signal, the velocity of the object and the direction of motion of the object,
wherein the processor is configured to generate the alert if the magnitude of the first signal exceeds a first threshold and the velocity of the object exceeds a second threshold; and
dynamically and in real time adjust the first threshold based on the velocity of the object and the direction of motion of the object.

11. The system of claim 10, wherein the first threshold is adjusted based on a position of a door being in an open state.

12. The system of claim 10, wherein the alert comprises a visible alert and an audible alert.

13. The system of claim 10, wherein the processor is further configured to filter stagnant objects without motion and noise produced by stagnant objects.

14. The system of claim 10, wherein the second sensor group is configured to not use magnetic field fluctuations to detect the motion of the object.

15. The system of claim 10, wherein the second sensor group comprises a plurality of sensors that are AC-coupled.

* * * * *